United States Patent [19]
Shou et al.

[11] Patent Number: 5,440,156
[45] Date of Patent: Aug. 8, 1995

[54] METAL OXIDE SEMICONDUCTOR FIELD EFFECT TRANSISTOR CELL ADAPTABLE FOR USE IN AN INTEGRATOR

[75] Inventors: Guoliang Shou; Weikang Yang; Wiwat Wongwirawipat; Sunao Takatori; Makoto Yamamoto, all of Tokyo, Japan

[73] Assignee: Yozan Inc., Tokyo, Japan

[21] Appl. No.: 986,764

[22] Filed: Dec. 8, 1992

[30] Foreign Application Priority Data

Sep. 1, 1992 [JP] Japan .................................. 4-257253

[51] Int. Cl.⁶ ..................... H01L 27108; H01L 29/00; H03K 17/687; G06G 7/18
[52] U.S. Cl. ..................................... 257/296; 257/379; 257/380; 257/532; 257/533; 307/109; 307/110; 327/336; 327/581
[58] Field of Search ............... 257/296, 379, 380, 532, 257/533; 307/109, 110, 304, 448, 575, 577, 571; 328/127

[56] References Cited

U.S. PATENT DOCUMENTS 4,967,109 10/1990 Steigerwald ...................... 307/571
5,172,018 12/1992 Colandrea et al. ................. 307/571

OTHER PUBLICATIONS

Electronics Handbook, Electronic Society, May 18, 1975, pp. 1703–1704.
Handbook for the Most Use of Analog IC, CQ Publishing Kabushiki Kaisha, Jan. 20, 1992, pp. 135–142.

*Primary Examiner*—Steven H. Loke
*Attorney, Agent, or Firm*—Cushman, Darby & Cushman

[57] ABSTRACT

A MOSFET wherein cell includes a MOSFET transistor having a gate connected to an input voltage signal for integration, a source grounded through a high resistance, and a drain connected to a power source. An output capacitor is connected to the source of the MOSFET transistor to complete the MOSFET cell.

4 Claims, 2 Drawing Sheets

METAL OXIDE SEMICONDUCTOR FIELD EFFECT TRANSISTOR CELL ADAPTABLE FOR USE IN AN INTEGRATOR

FIELD OF THE INVENTION

The present invention relates to a metal oxide semiconductor field effect transistor (MOSFET) cell, and more particularly to a MOSFET cell effective for integrating signals in an IC.

BACKGROUND OF THE INVENTION

Conventionally, it has been necessary to use a device having a plural number of inputs in order to perform signal integration, It has also been necessary to use different devices having the same number of inputs as a number of signals applied for a particular integration.

When the same circuit for each particular integration is realized in an IC, many libraries of the IC have been necessary, which is very inefficient.

SUMMARY OF THE INVENTION

The present invention solves the above mentioned problems and has an object to provide a cell easily adaptable to realize the integration of plural inputs.

The MOSFET cell according to the present invention achieves the objects by connecting an output capacitor to the source of a MOSFET transistor.

PREFERRED EMBODIMENT OF THE INVENTION

An embodiment of MOSFET cell according to the present invention is described with reference to the attached drawings.

Figure 1:
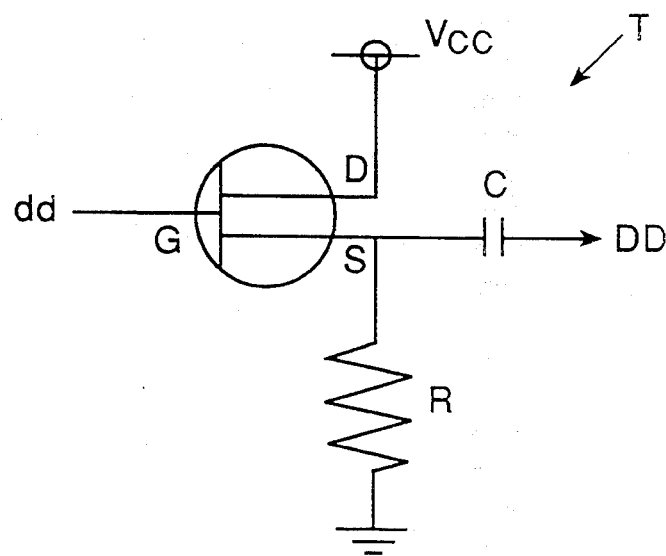
FIG. 1 shows an embodiment of a MOSFET cell according to the present invention

In FIG. 1 with respect to MOSFET cell "T" contains a MOSFET transistor M. The gate "G" of MOSFET transistor M is connected to input voltage "dd". A drain "D" is connected to power source "Vcc" and source "S" is grounded through high resistance "R". Output capacitor "C" is connected to source "S", and the output "DD" of capacitor "C" is the output of MOSFET cell "T".

Figure 2:
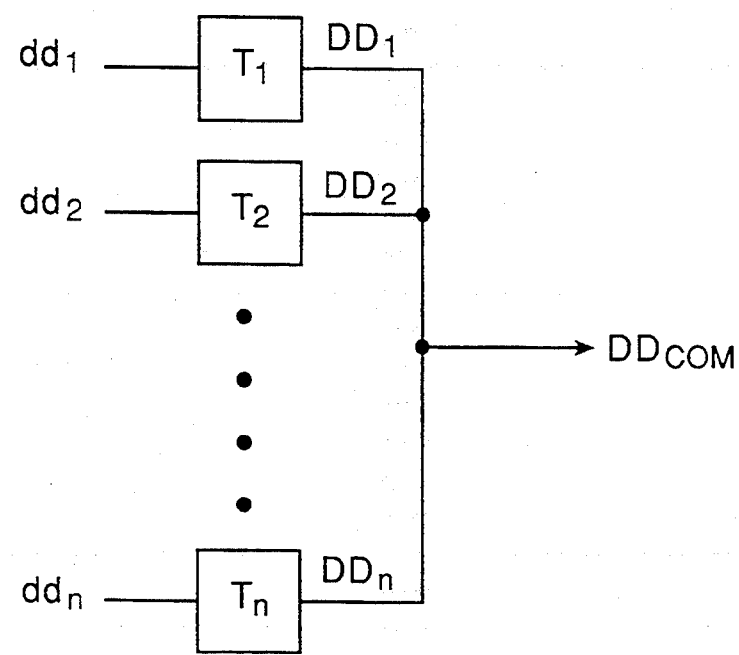
FIG. 2 shows the block diagram of the structure of a circuit for signal integration using the MOSFET cell of FIG. 1.

FIG. 2 shows the structure of the circuit for integrating signals. The outputs $DD_1$, $DD_2$ to $DD_n$ of a plural number of MOSFET cells T to Tn are connected to the common output (the voltage of it is "$DD_{COM}$). Representing tile volume of output capacitors for MOSFET cells T1 to Tn by C1 to Cn, respectively, and the volume of electricity of the capacitors by Q1 to Qn, respectively, the equations in (1) are formulated.

$$Q_1 = C_1 (dd_1 - DD_{COM})$$
$$Q_2 = C_2 (dd_2 - DD_{COM})$$ (1)
$$\vdots$$
$$Q_k = C_k (dd_k - DD_{COM})$$
$$\vdots$$
$$Q_n = C_n (dd_n - DD_{COM})$$

The total summations of both members are expressed in formula (2).

$$\sum_{i=1}^{n} Q_i = \sum_{i=1}^{n} C_i \times dd_i - DD_{COM} \times \sum_{i=1}^{n} C_i$$

In formula (2), as $\Sigma C_i$ and $\Sigma Q_1$ are constants, formula (2) is varied into (3) of tile equation for $DD_{COM}$, representing them by "Ct" and "Qt" respectively.

$$DD_{COM} = \left( \sum_{i=1}^{n} C_i \times dd_i - Q_t \right) / C_t \quad (3)$$

As is clear from formula (3), $DD_{COM}$ is a linear function of the weighted summation (the weight being "Ci" of the input voltages $dd_1$. When the electrical charge of each capacitor "Ci" is 0, "Qt" is also 0. In such a condition, the offset formula (3) can be deleted and formula (4) can be obtained.

$$DD_{COM} = \sum_{i=1}^{n} C_i \times dd_i / C_t \quad (4)$$

As shown above, it is a simple summation of electrical charge.

Thus signal integration can be easily realized without using plural input devices and a circuit module.

Figure 3:
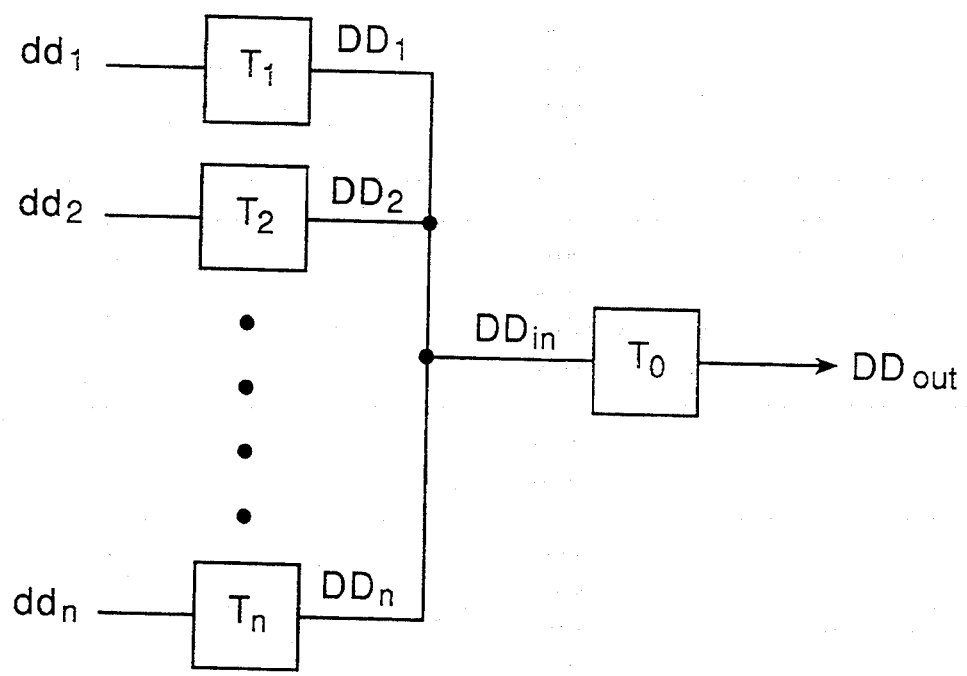
FIG. 3 shows a block diagram of the structure of a circuit for hierarchical signal integration using the MOSFET cell of FIG. 1.

FIG. 3 shows a structure for inputting such integration from FIG. 2 to a similar MOSFET cell To. The common output of MOSFET cells T1 to Tn is connected to "$dd_{in}$" of the input MOSFET cell To. It is possible not only to drive the MOSFET cell by the integrated output but also to integrate the output with the output of the transistor. That is, hierarchical integration of information is possible.

As above mentioned, it is possible to realize easily the integration of plural inputs by a MOSFET cell according to the present invention because an output capacitor is connected to the source of a MOSFET transistor.

What is claimed is:

1. A repeatable cell for an integrated circuit connectable to one of an output and a next cell input terminal and also connectable between a power supply and a ground potential comprising:

a metal oxide semiconductor field effect transistor having a gate, a source and a drain, said drain connectable to said power supply;

an input terminal connected to said gate of said transistor;

a resistance connected to said source of said transistor and connectable between said source and said ground potential; and an output capacitor having a first electrode connected to said source of said transistor and a second electrode connectable to said one of said output and said next cell input terminal, but not to said gate of said field effect transistor.

2. An integrated circuit integrator connected between a power supply and a ground potential comprising:

a common output; and a plurality of first cells, each first cell including:
- a first cell metal oxide semiconductor field effect transistor having a gate, a source and a drain, said drain connected to said power supply;
- a first cell input terminal connected to said gate of said first cell transistor;
- a first cell resistance connected between said source of said first cell transistor and said ground potential; and
- a first cell output capacitor including a first electrode and a second electrode, said first electrode connected to said source of said first cell transistor and said second electrode connected to said common output.

3. An integrator according to claim 2 further comprising a second cell, said second cell including:
- a second cell metal oxide semiconductor field effect transistor having a gate, a source and a drain, said drain of said second cell transistor connected to said power supply;
- a second cell input terminal connected between said gate of said second cell transistor and said common output;
- a second cell resistance connected between said source of said second cell transistor and said ground potential; and
- a second cell output capacitor including a first electrode and a second electrode, said first electrode of said second cell capacitor connected to said source of said second cell transistor and said second electrode of said second cell capacitor connected to a second cell output.

4. An integrated circuit integrator connected between a power supply and a ground potential comprising:
- a plurality of substantially identical cells, each cell including:
  - a metal oxide semiconductor field effect transistor having a gate, a source and a drain, said drain connected to said power supply;
  - an input terminal connected to said gate of said transistor, each input terminal inputting an input integrating signal;
  - a resistance connected between said source of said transistor and said ground potential; and
  - an output capacitor including a first electrode and a second electrode, said first electrode connected to said source of said transistor and said second electrode for each of said plurality of cells connected to a common output, said common output outputting an integrated signal obtained from a summation of charge by said output capacitors proportional to said input integrating signals.

* * * * *